(12) United States Patent
Wu et al.

(10) Patent No.: US 11,877,382 B2
(45) Date of Patent: Jan. 16, 2024

(54) IMMERSION COOLING SYSTEM IN MINIATURIZED FORM

(71) Applicant: Shenzhen Fulian Fugui Precision Industry Co., Ltd., Shenzhen (CN)

(72) Inventors: Jia-Hong Wu, New Taipei (TW); Li-Wen Guo, Shenzhen (CN); Hsin-Ting Lin, New Taipei (TW)

(73) Assignee: Shenzhen Fulian Fugui Precision Industry Co., Ltd., Shenzhen (CN)

( * ) Notice: Subject to any disclaimer, the term of this patent is extended or adjusted under 35 U.S.C. 154(b) by 0 days.

(21) Appl. No.: 17/892,280

(22) Filed: Aug. 22, 2022

(65) Prior Publication Data
US 2023/0240041 A1 Jul. 27, 2023

(30) Foreign Application Priority Data
Jan. 21, 2022 (CN) .......................... 202210073667.9

(51) Int. Cl.
*H05K 7/20* (2006.01)

(52) U.S. Cl.
CPC ..... *H05K 7/20236* (2013.01); *H05K 7/20409* (2013.01); *H05K 7/20763* (2013.01)

(58) Field of Classification Search
CPC ........... H05K 7/20236; H05K 7/20272; H05K 7/20263; H05K 7/20781; H05K 7/20281; H05K 7/20409; H05K 7/20772; H05K 5/067; H05K 7/1461; H05K 7/20154; H05K 7/20909; H05K 7/20918; F28F 27/00; G06F 1/20; G06F 2200/201; G06F 1/181; G06F 1/183
See application file for complete search history.

(56) References Cited

U.S. PATENT DOCUMENTS

| | | | | |
|---|---|---|---|---|
| 4,656,559 A | * | 4/1987 | Fathi | H05K 7/1461 361/721 |
| 6,046,908 A | * | 4/2000 | Feng | H05K 7/20154 361/730 |
| 6,504,719 B2 | * | 1/2003 | Konstad | F28F 3/12 361/689 |
| 6,979,772 B2 | * | 12/2005 | Meng-Cheng | G06F 1/20 174/15.1 |
| 7,414,845 B2 | * | 8/2008 | Attlesey | G06F 1/185 257/E23.095 |
| 8,035,964 B2 | * | 10/2011 | Biagini | H05K 7/20918 165/185 |
| 11,032,939 B2 | * | 6/2021 | Tufty | H05K 7/20772 |
| 2002/0117291 A1 | * | 8/2002 | Cheon | G06F 1/20 165/80.4 |

(Continued)

FOREIGN PATENT DOCUMENTS

| CN | 101308269 A | 11/2008 |
|---|---|---|
| CN | 206348737 U | 7/2017 |
| CN | 113721718 A | 11/2021 |

*Primary Examiner* — Abhishek M Rathod
(74) *Attorney, Agent, or Firm* — ScienBiziP, P.C.

(57) ABSTRACT

An immersion cooling system miniaturized by the omission of a pump and heat exchanger includes a first casing for containing a non-conductive coolant in which a heat-generating component is immersed, fins disposed on and located outside the first casing, and a second casing. The first casing is disposed in the second casing, and the second casing defines a first vent hole exposing the fins. The immersion cooling system dissipates heat by means of natural convection.

10 Claims, 5 Drawing Sheets

(56) References Cited

U.S. PATENT DOCUMENTS

| | | | |
|---|---|---|---|
| 2008/0017355 A1* | 1/2008 | Attlesey | G06F 1/181 |
| | | | 165/104.33 |
| 2010/0039771 A1* | 2/2010 | Marchand | H05K 7/20909 |
| | | | 361/694 |
| 2019/0380228 A1* | 12/2019 | Hirai | H05K 7/20772 |
| 2021/0378142 A1* | 12/2021 | Zhang | G06F 1/20 |

\* cited by examiner

IMMERSION COOLING SYSTEM IN MINIATURIZED FORM

FIELD

The subject matter herein generally relates to immersion cooling systems, in particular to an immersion cooling system dissipating heat through natural convection heat dissipation.

BACKGROUND

At present, the cooling of electronic equipment may be in two general categories. First, a fan can be used to drive air to flow through electronic components to remove heat from the electronic components. Second, the electronic components can be immersed in a non-conductive coolant, the liquid heated by the components is sucked into a heat exchanger through a pump to give up the absorbed heat with the heat exchanger, and then the cooled liquid is recycled back to a tank to complete a cycle, so that the heat generated by the electronic components is continuously dissipated. With advancement of science and technology, the power consumptions and heat-generating values of electronic components are increasing. Loud noise and high energy consumption may occur when fan is used to dissipate heat from the electronic components. When a dissipating system including the heat exchanger and a pump is used to dissipate heat from the electronic components, the dissipating system occupies a large space.

BRIEF DESCRIPTION OF THE DRAWINGS

Implementations of the present technology will now be described, by way of embodiment, with reference to the attached figures.

DETAILED DESCRIPTION

Figure 1:
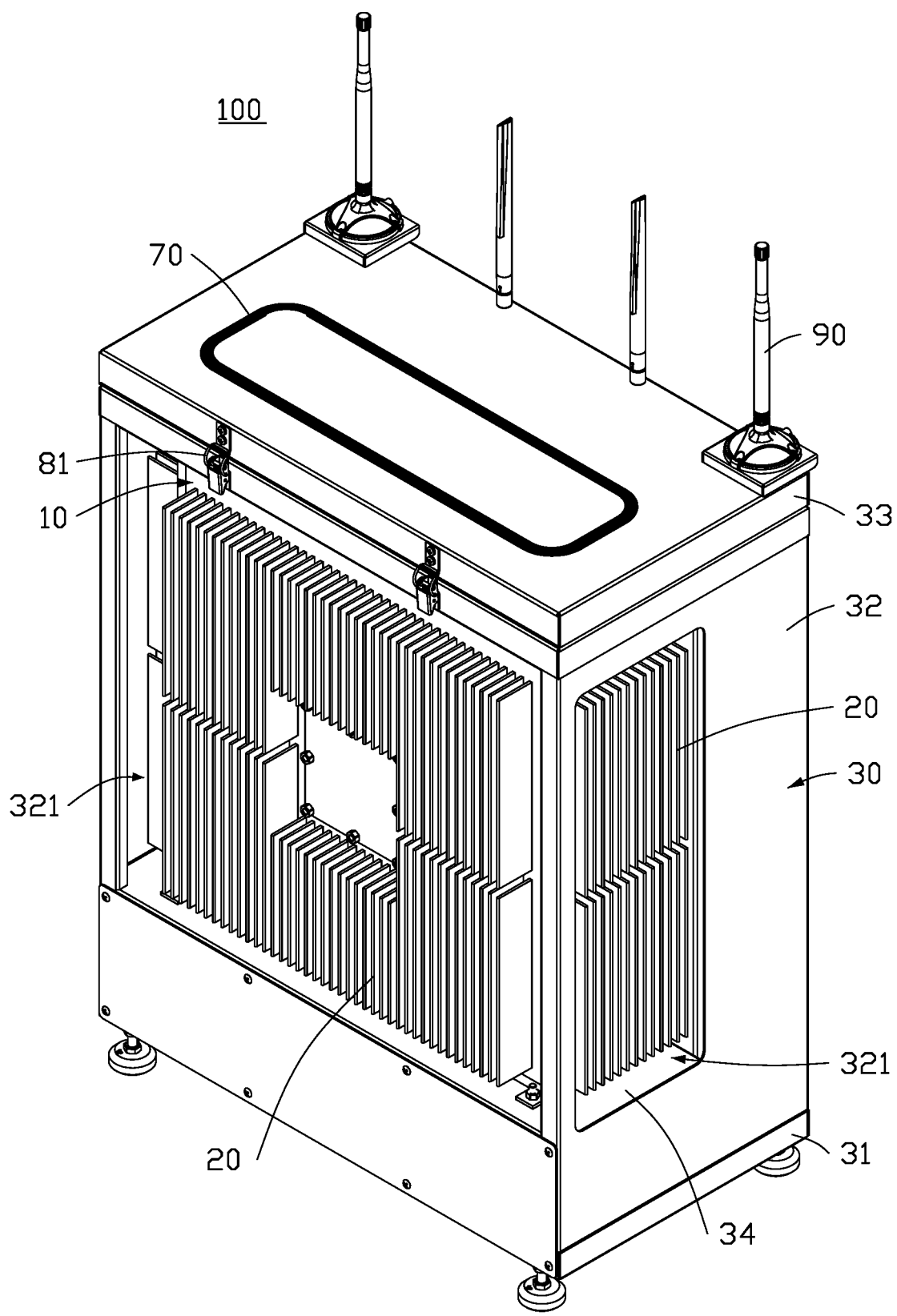
FIG. 1 is a perspective view of an immersion cooling system according to an embodiment of the present disclosure.
Figure 2:
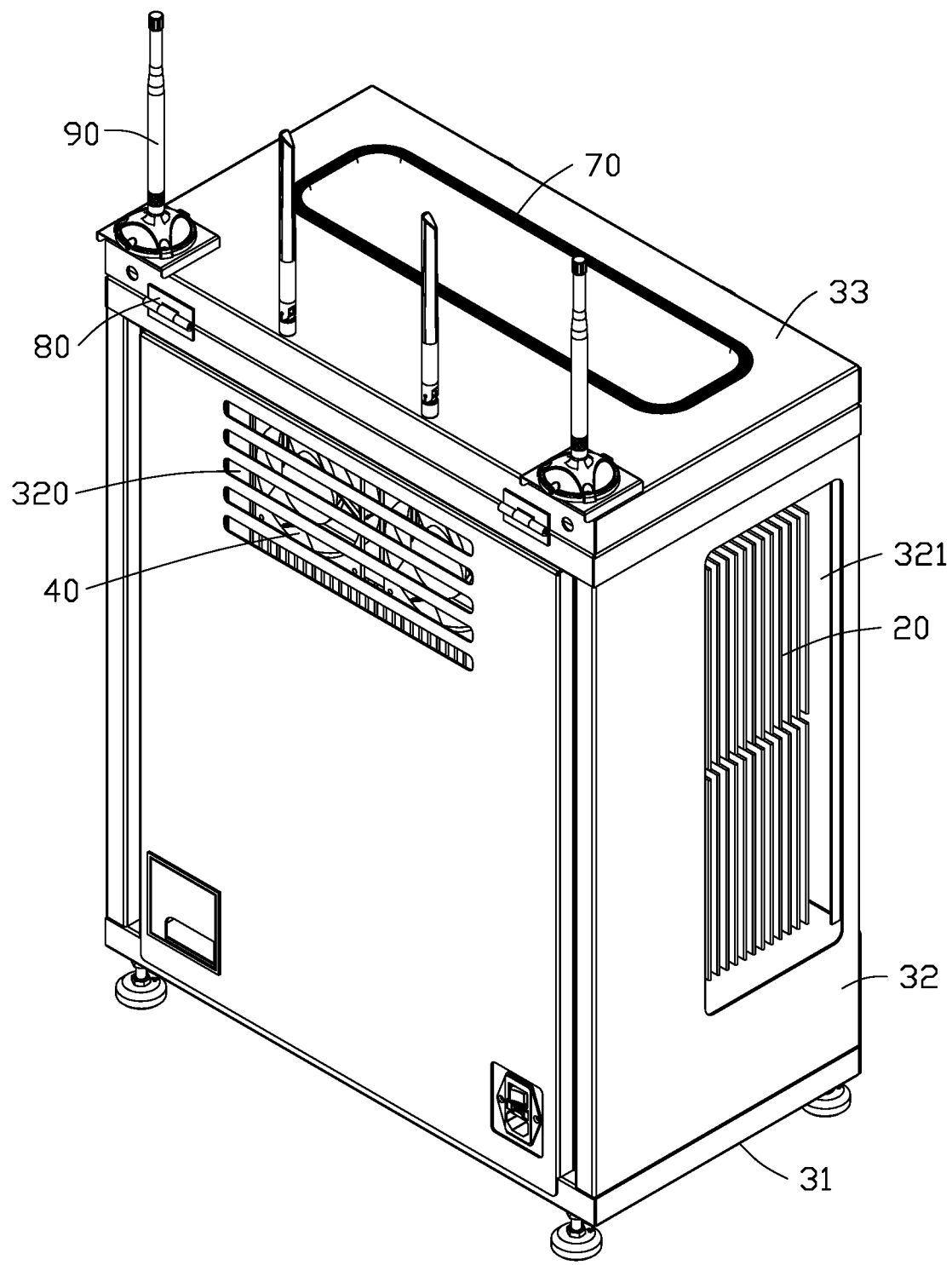
FIG. 2 is a perspective view of the immersion cooling system of FIG. 1 from another perspective.
Figure 3:
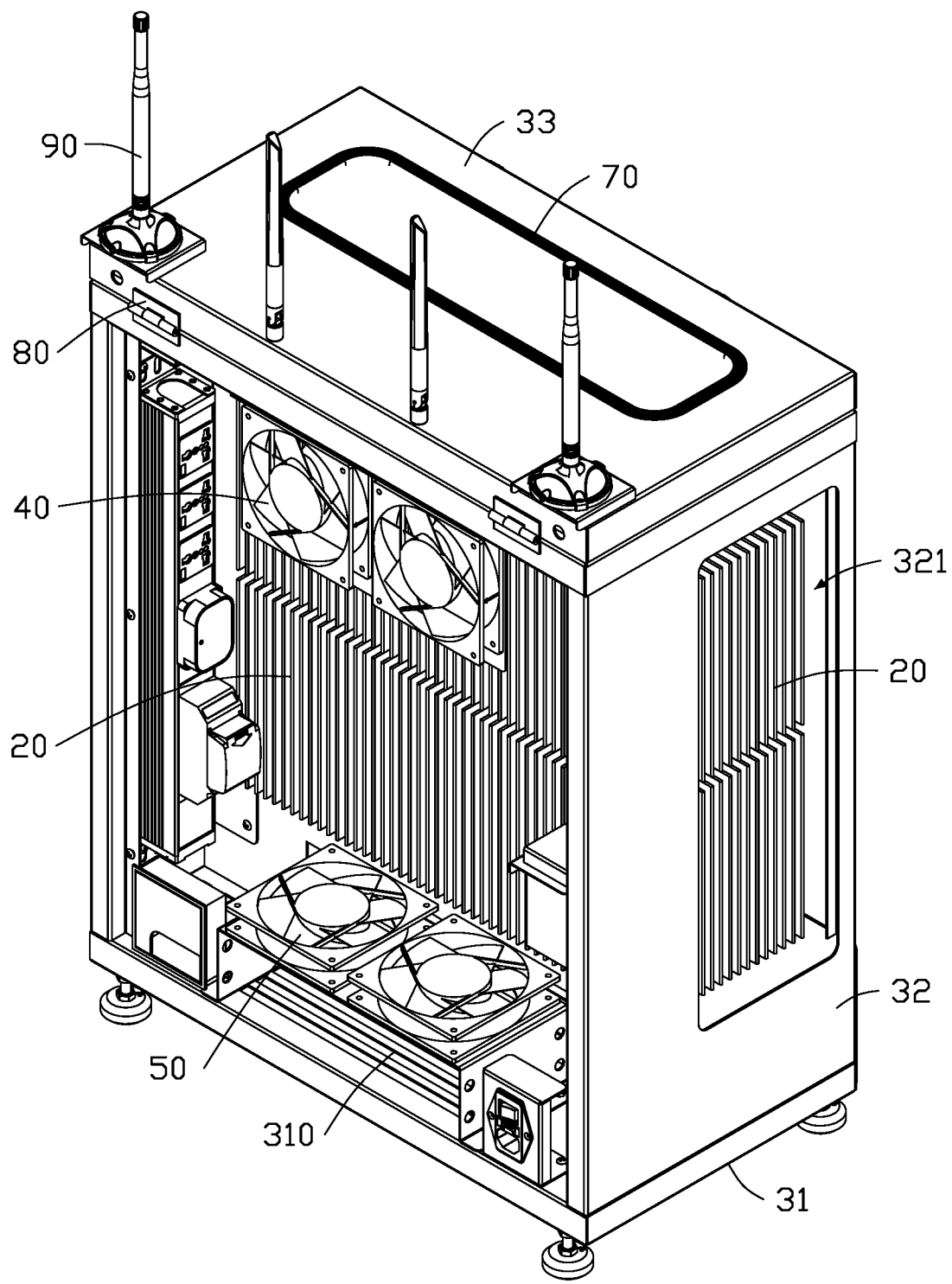
FIG. 3 is a perspective view of a local structure of the immersion cooling system of FIG. 1.
Figure 4:
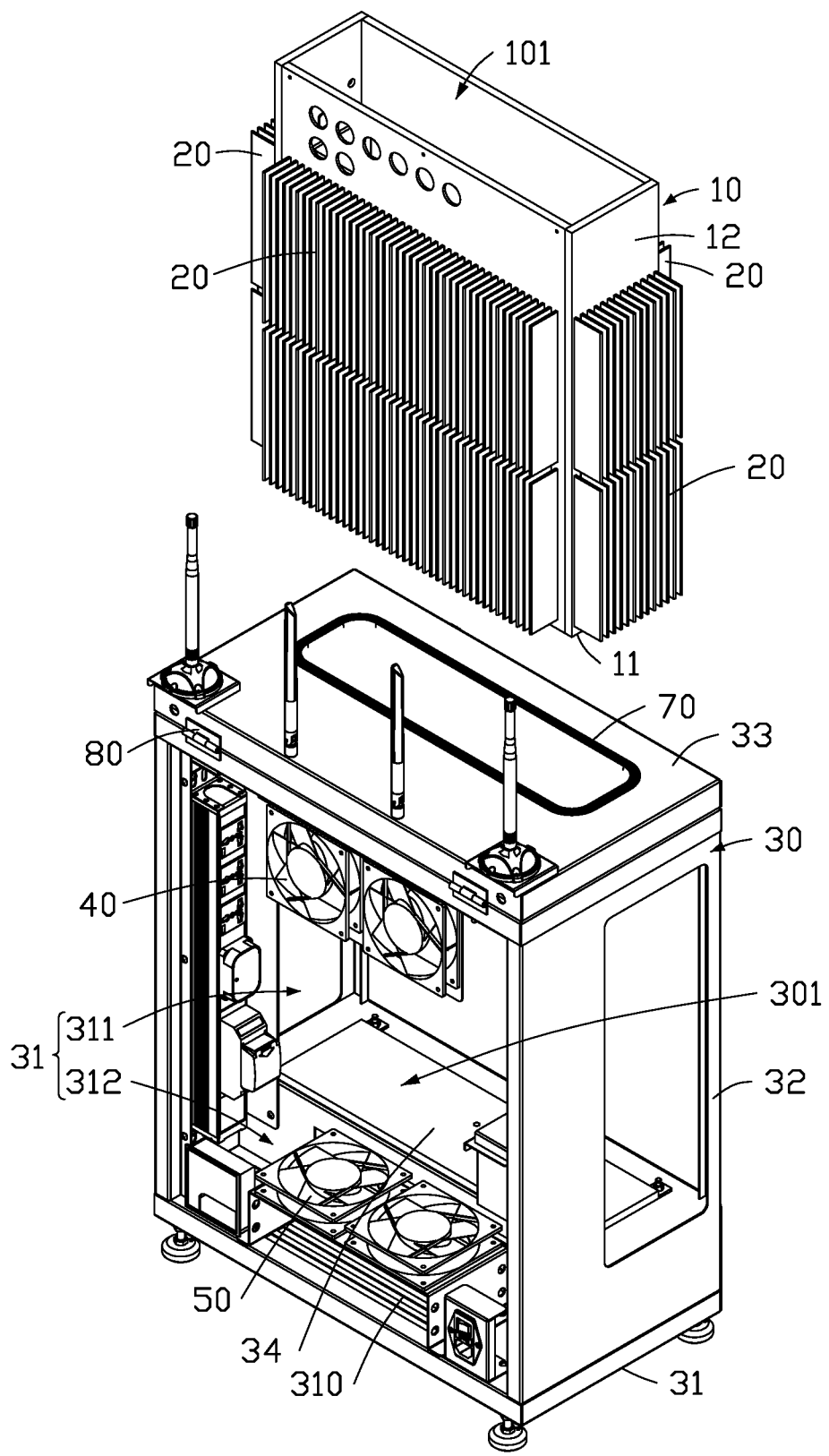
FIG. 4 is an exploded of the immersion cooling system of FIG. 3.

The technical solutions in one embodiments of the present disclosure are clearly and completely described in the following with reference to the accompanying drawings in one embodiments of the present disclosure. The described embodiments are only some of the embodiments of the present disclosure, and not all of the embodiments. All other embodiments obtained by those skilled in the art based on the embodiments of the present disclosure without creative efforts are within the scope of the present disclosure.

Unless otherwise defined, all technical and scientific terms used herein have the same meaning as those understood in the art. The terminology used in the description of the present disclosure is for the purpose of describing particular embodiments and is not intended to limit the disclosure.

Some embodiments of the present disclosure are described in detail below with reference to the accompanying drawings. The features of the embodiments and examples described below can be combined with each other without conflict.

Referring to FIGS. 1 to 5, an embodiment of an immersion cooling system 100 is illustrated. The immersion cooling system 100 is used to cool a heat-generating component 200. The heat-generating component 200 may be a server, an electronic chip, a battery, etc. In one embodiment, the heat-generating component 200 is a server. The immersion cooling system 100 includes a first casing 10, a plurality of fins 20, and a second casing 30. The first casing 10 is suitable for housing a non-conductive coolant 210 in which the heat-generating component 200 is immersed. The first casing 10 is disposed on the second casing 30. The non-conductive coolant 210 may be, but is not limited to, synthetic oil or fluorinated liquid. The fins 20 are disposed on the first casing 10 and are located between the first casing 10 and the third casing 30.

The first casing 10 includes a first bottom plate 11 and a plurality of first side plates 12 protruding vertically from a periphery of the first bottom plate 11. The first bottom plate 11 and the plurality of first side plates 12 cooperatively form a first accommodation cavity 101. The non-conductive coolant 210 is accommodated in the first accommodation cavity 101. In one embodiment, the first casing 10 includes four first side plates 12, and the first casing 10 is substantially rectangular. In other embodiment, the number of the first side plates 12 may be set according to needs. The first casing 10 is made of a heat conducting material to improve the heat dissipation efficiency. The heat conducting material may be metal or the like. In one embodiment, the first casing 10 is made of aluminum.

In one embodiment, the first casing 10 includes a top plate (not shown) which is disposed on edges of the first side plates 12 away from the first bottom plate 11 for enclosing the first accommodation cavity 101. The top plate can cover the plurality of first side plates 12 to enclose and seal the first accommodation cavity 101 and can be opened relative to the plurality of first side plates 12 to expose the first accommodation cavity 101.

Each of the plurality of first side plates 12 is provided with a plurality of fins 20, and the plurality of fins 20 are located outside the first casing 10. Each of the fins 20 extends away from a side of one first side plate 12 connecting with the first bottom plate 11. That is, each of the fins 20 extends along a height direction of the first casing 10. In this embodiment, the plurality of fins 20 on each of the plurality of first side plates 12 are arranged in two groups in the height direction of the first casing 10. The fins 20 are made of a heat conducting material. A material of the fins 20 may be, but is not limited to, aluminum. The fins 20 and the first casing 10 may be formed separately or as an integral unit.

In some embodiments, the fins 20 are coated with a coating (not shown) with a high heat radiation to improve the heat dissipation efficiency. The coating may be a black paint coating.

The second casing 30 includes a second bottom plate 31, a plurality of second side plates 32 protruding vertically from the second bottom plate 21, and a top plate 33 disposed on sides of the plurality of second side plates 32 away from the second bottom plate 31. The second bottom plate 31, the plurality of second side plates 32, and the top plate 33 cooperatively form a second accommodation cavity 301. The first casing 10 is fixedly disposed in the second accommodation cavity 301. In one embodiment, the second casing 30 includes four second side plates 32 which correspond to positions of the four first side plates 12.

The top plate 33 further encloses the first accommodation cavity 101. In some embodiments, the top plate 33 is provided with a protrusion (not shown), which can extend into the first accommodation cavity 101 to enclose the first accommodation cavity 101. A sealing member 70 is disposed between the top plate 33 and the first accommodation cavity 101 to seal the first accommodation cavity 101. The sealing member 70 may be, but is not limited to, a sealing ring.

In some embodiments, an edge of the top plate 33 is rotatably connected with one of the second side plates 32 to facilitate the opening and closing of the top plate 33. In one embodiment, the top plate 33 and the one of the second side plates 32 are rotatably connected by a hinge 80.

In some embodiments, two latching structures 81 matched with each other are disposed on one of the second side plates 32 and the top plate 33 and fixedly connect the top plate 33 and the one of the second side plates 32 when the top plate 33 encloses the second accommodation cavity 301. The two latching structures 81 may be, but are not limited to, two clamping hooks or one clamping hook and one matching hole.

In some embodiments, an antenna 90 is disposed on the top plate 33.

At least one second side plate 32 defines a first vent hole 321. The plurality of fins 20 on one of the first side plates 12 are exposed from the first vent hole 321, so that these fins 20 are exposed to an external environment through the first vent hole 321, and by natural convection heat is carried out through the fins 20. Some or all of the plurality of fins 20 on one of the first side plates 12 may be exposed from one first vent hole 321. In one embodiment, three second side plates 32 define three first vent holes 321, and the fins 20 on three first side plates 12 are all exposed from the three first vent holes 321 respectively. Heat generated by the heat-generating component 200 is transferred to the first casing 10 through the non-conductive coolant 210, and then discharged to the external environment through the fins 20.

In some embodiments, the immersion cooling system 100 further includes a first turbulence generator 40. The first turbulence generator 40 is disposed on one second side plate 32 without the first vent hole 321, and is accommodated in the second accommodation cavity 301. The second side plate 32 without the first vent hole 321 defines a second vent hole 320. The first turbulence generator 40 generates a forced airflow in the second accommodation cavity 301, and heat in the second accommodation cavity 301 is transferred to the external environment through the second vent hole 320 with the forced airflow. In one embodiment, a part of the first turbulence generator 40 is exposed from the second vent hole 320. The first turbulence generator 40 may be, but is not limited to, a fan.

In some embodiments, the second casing 30 further includes a partition wall 34. The partition wall 34 is disposed in the second accommodation cavity 301 and divides the second accommodation cavity 301 into a first portion 311 and a second portion 312 which communicates with the first portion 311. Specifically, the partition wall 34 is connected with three second side plates 32 and is spaced apart from the other second side plate 32. The first casing 10 and the first turbulence generator 40 are both disposed in the first portion 311 of the second accommodation cavity 301, and the first casing 10 is supported by the partition wall 34.

In some embodiments, the immersion cooling system 100 further includes a second turbulence generator 50. The second turbulence generator 50 is fixed on the second bottom plate 31 and is accommodated in the second portion 312 of the second accommodation cavity 301. The second bottom plate 31 defines a third vent hole 310. The second turbulence generator 50 generates a forced airflow in the second portion 312 of the second accommodation cavity 301, and heat in the second portion 312 of the second accommodation cavity 301 is transferred to the external environment through the third vent hole 310 with the forced airflow. In one embodiment, a part of the second turbulence generator 50 is exposed from the third vent hole 312. The second turbulence generator 50 may be, but is not limited to, a fan. The arrangement of the partition wall 34 provides separation of the natural convection region and the forced convection region in the second accommodation cavity 301, thereby improving the heat dissipation efficiency.

In some embodiment, the first airflow generating 40 and the second vent hole 320 are both arranged to be close to the top plate 33, thereby improving the heat dissipation efficiency.

Figure 5:
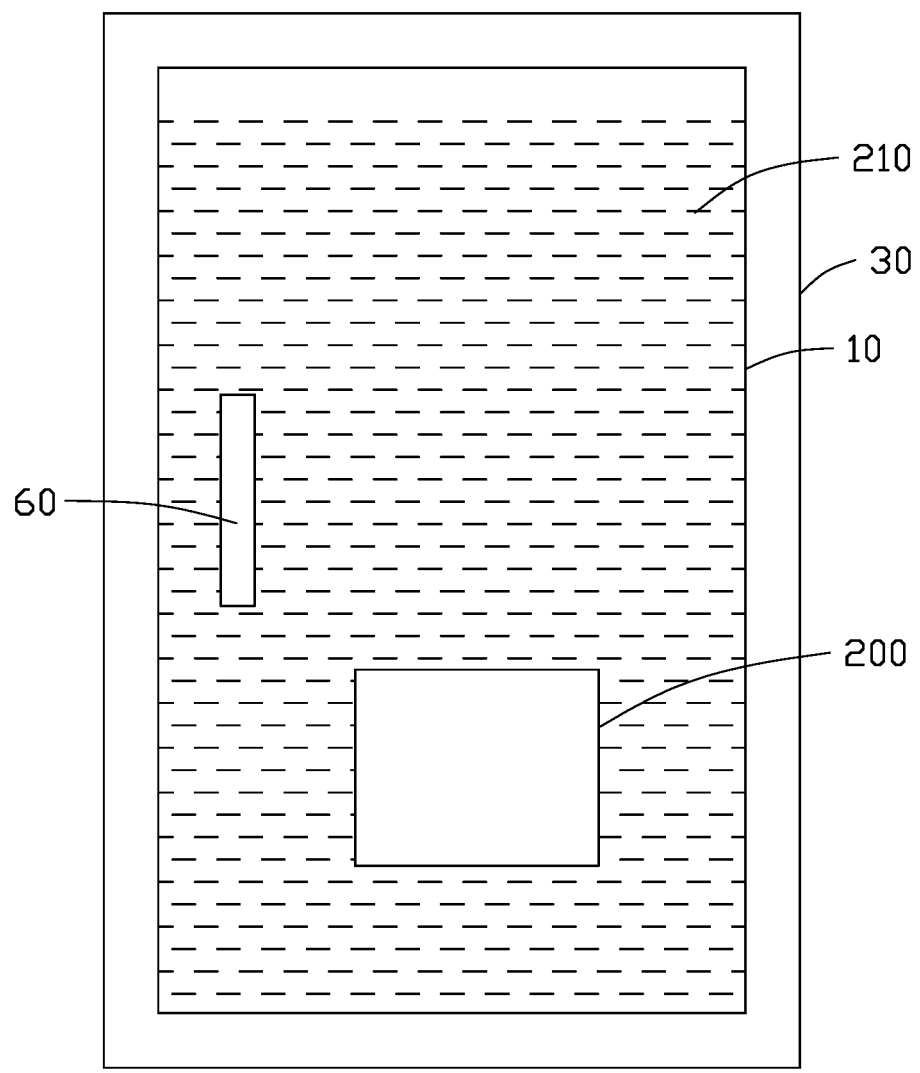
FIG. 5 is a schematic diagram of a heat-generating component and an immersion cooling system according to an embodiment of the present disclosure.

Referring to FIG. 5, in some embodiments, the immersion cooling system 100 further includes a third turbulence generator 60. The third turbulence generator 60 is disposed in the first accommodation cavity 101 and is configured to stir the non-conductive coolant 210, so that the temperature of the non-conductive coolant 201 is evenly distributed, which is conducive to heat dissipation. The third turbulence generator 60 may be, but is not limited to, a stirring rod.

The immersion cooling system 100 dissipates heat through natural convection which is carried out through the fins 20 disposed on the first casing 10 and the first vent hole 321 defined on the second casing 30. Such manner of dissipation has lower noise. In addition, since a pump and a heat exchanger are not disposed in the immersion cooling system 100 to dissipate heat, the immersion cooling system 100 is miniaturized.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. An immersion cooling system comprising:
a first casing configured for containing a non-conductive coolant in which a heat-generating component is immersed;
a plurality of fins disposed on and located outside the first casing; and
a second casing defining a first vent hole, wherein the first casing is disposed in the second casing, and the plurality of fins are exposed from the first vent hole;
the first casing comprises a first bottom plate and a plurality of first side plates protruding from the first bottom plate, the first bottom plate and the plurality of first side plates cooperatively form a first accommodation cavity for containing the non-conductive coolant, each of the plurality of first side plates is provided with a plurality of fins;
wherein the second casing comprises a second bottom plate, a plurality of second side plates protruding from the second bottom plate, and a top plate disposed on sides of the plurality of second side plates away from the second bottom plate;

the second bottom plate, the plurality of second side plates, and the top plate cooperatively form a second accommodation cavity;

the first casing is disposed in the second accommodation cavity, and at least one of the plurality of second side plates defines the first vent hole;

a first turbulence generator, wherein the first turbulence generator is disposed on one of the plurality of second side plates without the first vent hole, the one of the plurality of second side plates without the first vent hole defines a second vent hole, a part of the first generator is exposed from the second vent hole;

a partition wall and a second turbulence generator, wherein the partition wall is disposed in the second accommodation cavity and divides the second accommodation cavity into a first portion and a second portion communicating with the first portion, the first casing and the first turbulence generator are disposed in the first portion, and the second turbulence generator is disposed in the second portion;

the partition wall is connected with the plurality of second side plates without the second vent hole and spaced apart from the one of the plurality of second side plates with the second vent hole.

2. The immersion cooling system of claim 1, wherein each of the plurality of fins extends along a height direction of the first casing.

3. The immersion cooling system of claim 2, wherein the plurality of fins on each of the plurality of first side plates are arranged in two groups in the height direction of the first casing.

4. The immersion cooling system of claim 1, wherein the first casing comprises four first side plates, the second casing comprises four second side plates, and three second side plates define three first vent holes exposing all of the plurality of fins on three first side plates respectively.

5. The immersion cooling system of claim 1, wherein the second bottom plate defines a third vent hole, a part of the second turbulence generator is exposed from the third vent hole.

6. The immersion cooling system of claim 1, further comprising a third turbulence generator disposed in the first casing, wherein the third turbulence generator is configured to stir the non-conductive coolant contained in the first casing.

7. The immersion cooling system of claim 1, wherein the top plate and one of the plurality of second side plates are rotatably connected by a hinge.

8. The immersion cooling system of claim 1, wherein two latching structures matched with each other are disposed on the top plate and one of the plurality of second side plates respectively.

9. The immersion cooling system of claim 1, further comprising an antenna disposed on the top plate.

10. The immersion cooling system of claim 1, wherein a material of the first casing is aluminum.

* * * * *